United States Patent
Seo et al.

(10) Patent No.: US 10,194,543 B2
(45) Date of Patent: Jan. 29, 2019

(54) EXPANDABLE DISPLAY DEVICE

(71) Applicant: Samsung Display Co., Ltd., Yongin-si, Gyeonggi-do (KR)

(72) Inventors: Tae An Seo, Hwaseong-si (KR); Sun Ho Kim, Seongnam-si (KR); Sung Hoon Kim, Seoul (KR); Jung Hun Lee, Hwaseong-si (KR); Jin Hwan Choi, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/724,983

(22) Filed: Oct. 4, 2017

(65) Prior Publication Data
US 2018/0103552 A1    Apr. 12, 2018

(30) Foreign Application Priority Data

Oct. 11, 2016    (KR) .......................... 10-2016-0131399

(51) Int. Cl.
| | |
|---|---|
| *H05K 5/00* | (2006.01) |
| *H05K 5/02* | (2006.01) |
| *G06F 1/16* | (2006.01) |
| *G09F 9/30* | (2006.01) |

(52) U.S. Cl.
CPC .......... *H05K 5/0017* (2013.01); *G06F 1/1624* (2013.01); *G06F 1/1626* (2013.01); *G06F 1/1652* (2013.01); *G09F 9/301* (2013.01); *H05K 5/0217* (2013.01)

(58) Field of Classification Search
CPC combination set(s) only.
See application file for complete search history.

(56) References Cited

U.S. PATENT DOCUMENTS

| | | | |
|---|---|---|---|
| 7,426,107 B2* | 9/2008 | Yeh ...................... | G06F 1/1626 340/815.4 |
| 7,558,057 B1* | 7/2009 | Naksen ................. | G06F 1/1613 361/679.3 |
| 7,724,508 B2* | 5/2010 | Bemelmans .......... | G06F 1/1615 345/168 |

(Continued)

FOREIGN PATENT DOCUMENTS

| | | |
|---|---|---|
| KR | 10-2015-0043647 | 4/2015 |
| KR | 10-1570869 | 11/2015 |
| KR | 10-1614826 | 4/2016 |

*Primary Examiner* — Lisa Lea Edmonds
(74) *Attorney, Agent, or Firm* — Lewis Roca Rothgerber Christie LLP

(57) ABSTRACT

An expandable display device includes: a housing including a fixing portion; a pair of sliding portions provided at respective sides of the fixing portion, each of the sliding portions being configured to be drawn out from the housing along a first direction such that a distance from the respective sliding portion to the fixing portion is changed; and a panel unit including: a fixing display unit on the fixing portion; and a pair of expanding display units on the pair of sliding portions and having a variable exposing area; a flexible display panel including a plurality of pixels and having a screen at a first side thereof; and a support panel attached to a second side of the flexible display panel facing the first side, the support panel including a plurality of slits extending in a second direction crossing the first direction.

14 Claims, 15 Drawing Sheets

(56) References Cited

U.S. PATENT DOCUMENTS

| | | | | |
|---|---|---|---|---|
| 7,830,333 B2* | 11/2010 | Aoki | | G06F 1/1601 345/1.3 |
| 8,379,377 B2* | 2/2013 | Walters | | G06F 1/1641 248/917 |
| 8,493,726 B2* | 7/2013 | Visser | | G06F 1/1601 361/679.05 |
| 8,508,920 B2* | 8/2013 | Huitema | | G09F 9/301 312/223.3 |
| 8,711,566 B2* | 4/2014 | O'Brien | | G06F 1/1624 361/724 |
| 9,019,313 B2* | 4/2015 | Kwack | | G06F 1/1652 345/173 |
| 9,911,369 B2* | 3/2018 | Kim | | G09F 9/301 |
| 2003/0160735 A1* | 8/2003 | Lee | | G06F 3/147 345/4 |
| 2008/0211733 A1* | 9/2008 | Huitema | | G02F 1/133305 345/3.1 |
| 2012/0162876 A1* | 6/2012 | Kim | | H04M 1/0237 361/679.01 |
| 2012/0212433 A1* | 8/2012 | Lee | | G06F 1/1652 345/173 |
| 2012/0314400 A1* | 12/2012 | Bohn | | G09F 9/301 362/97.1 |
| 2014/0247544 A1* | 9/2014 | Ryu | | G09F 11/18 361/679.01 |
| 2016/0081204 A1* | 3/2016 | Park | | G06F 1/1652 361/807 |
| 2016/0320804 A1* | 11/2016 | Takayanagi | | G06F 1/1615 |
| 2016/0374228 A1* | 12/2016 | Park | | G09F 9/301 |
| 2017/0280570 A1* | 9/2017 | Li | | H05K 5/0217 |
| 2017/0290175 A1* | 10/2017 | Malik | | H05K 5/0017 |
| 2018/0077808 A1* | 3/2018 | Seo | | H05K 5/0017 |
| 2018/0081473 A1* | 3/2018 | Seo | | H05K 5/0217 |
| 2018/0103550 A1* | 4/2018 | Seo | | H01F 7/0205 |

\* cited by examiner

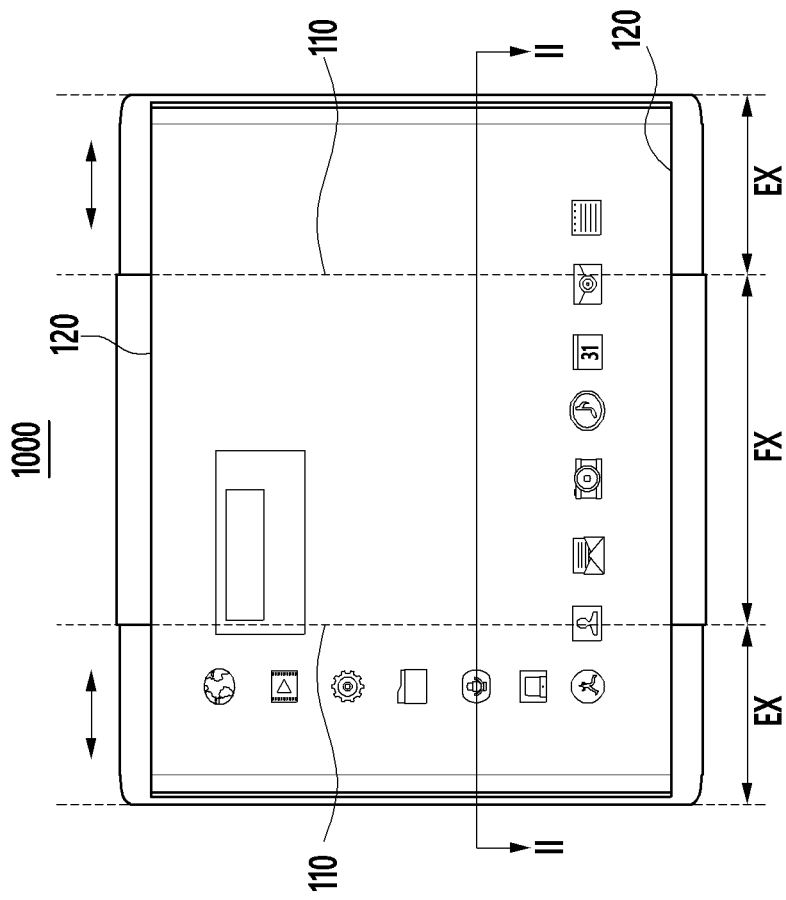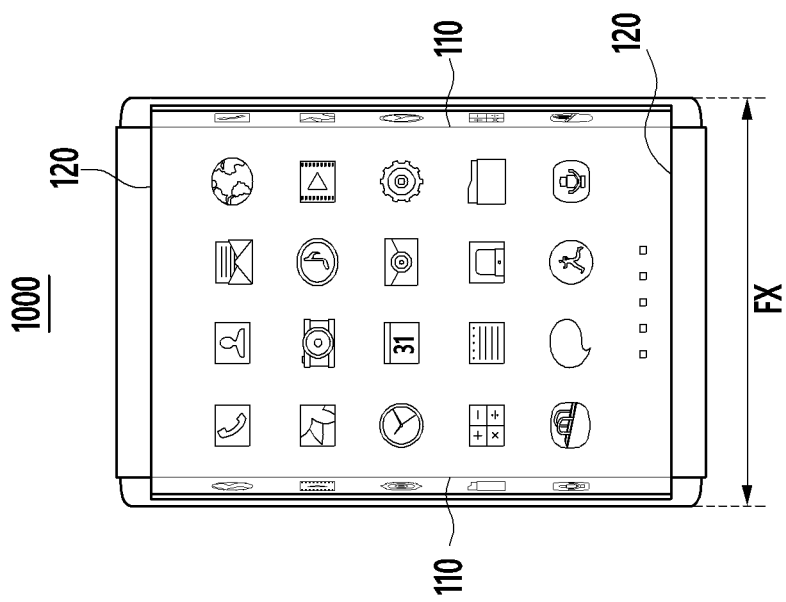

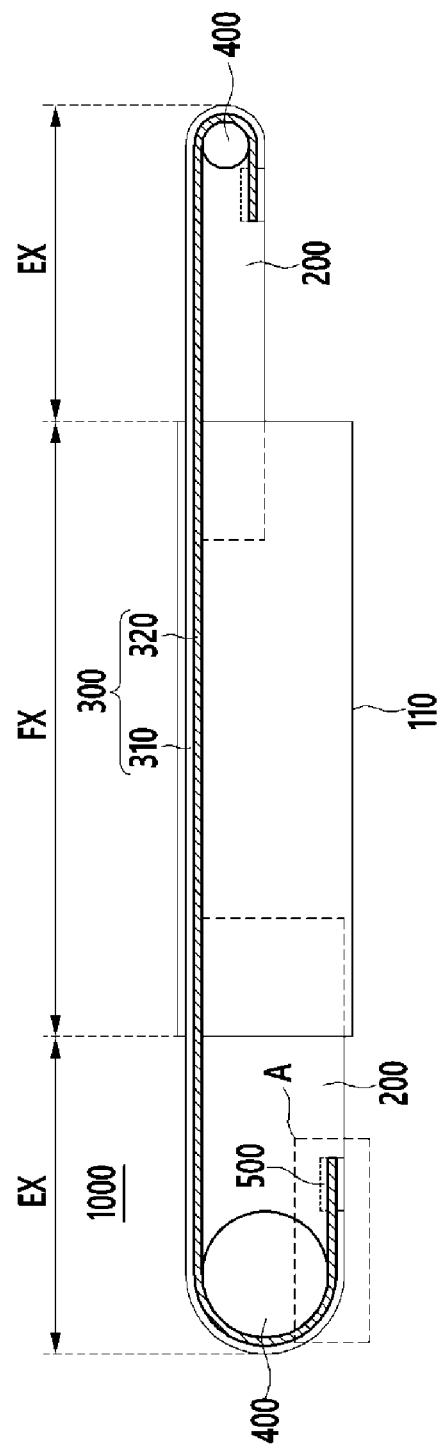

EXPANDABLE DISPLAY DEVICE

CROSS-REFERENCE TO RELATED APPLICATION

This application claims priority to, and the benefit of, Korean Patent Application No. 10-2016-0131399, filed in the Korean Intellectual Property Office on Oct. 11, 2016, the entire contents of which are incorporated herein by reference.

BACKGROUND

1. Field

The present disclosure relates to an expandable display device.

2. Description of the Related Art

As the demand for display devices has increased, consumer demand for various screen sizes of display devices has also increased. In general, most consumers like a big and clear screen when it is displayed, and they like a small and light display device when the screen is not displayed, for example, when the consumer carries the display device or travels with the display device.

To satisfy their requirements, expandable display devices for increasing or reducing screen size depending on various needs have appeared. The expandable display device represents a display device for consumers to operate the device to expand the screen when needed (or desired), and to reduce the screen size when the consumer needs (or desires) to carry the display device or travel with the display device, thereby improving portability thereof.

The expandable display device may be provided with a flexible display panel that has a flexible characteristic, and of which an external shape is relatively easily transformed. However, the flexible display panel is typically relatively weak in terms of external impacts and durability, and when a signal is input thereto by a touch method, support is typically weak and such use may be inconvenient.

Therefore, the expandable display device using a flexible display panel requires a solution with respect to external impacts and durability as well as improving supportability.

The above information disclosed in this Background section is only for enhancement of understanding of the background of the described technology and therefore it may contain information that does not form prior art.

SUMMARY

Embodiments of the present invention relate to an expandable display device that may be expanded or reduced in a stable manner.

The technical feature to be achieved by the present invention is not limited to the discussion herein, and other aspects, features, and technical featurs will be apparent to those skilled in the art from the description below.

An exemplary embodiment provides an expandable display device including: a housing including a fixing portion; a pair of sliding portions provided at respective sides of the fixing portion, each of the sliding portions being configured to be drawn out from the housing along a first direction such that a distance from the respective sliding portion to the fixing portion is changed; and a panel unit including: a fixing display unit on the fixing portion; and a pair of expanding display units on the pair of sliding portions and having a variable exposing area; a flexible display panel including a plurality of pixels and having a screen at a first side thereof; and a support panel attached to a second side of the flexible display panel facing the first side, the support panel including a plurality of slits extending in a second direction crossing the first direction.

The support panel may include a bridge extending in the first direction and dissecting the plurality of slits.

The bridge may include a plurality of bridges.

The plurality of slits may be at a portion of the support panel on the fixing display unit.

The plurality of slits may further be at a portion of the support panel on the expanding display units, and widths of slits from among the plurality of slits that are at the portion of the support panel on the expanding display unites may be greater than widths of slits from among the plurality of slits that are at the portion of the support panel on the fixing display unit.

The support panel may include a support portion having the plurality of slits and supporting the display panel, and a cover portion covering a side of the support portion.

The expandable display device may further include a roller at an end portion of one of the sliding portions, and the roller may be configured to rotate to change the exposing area of the respective expanding display unit. The support panel may contact a surface of the roller and may wrap around the surface of the roller. The end portion of the support panel may further include a combining portion that is substantially planar and may face the plurality of slits.

The roller may include a first roller and a second roller, the first roller having a first diameter that is greater than a diameter of the second roller. A width of a slit from among the plurality of slits that is drawn out by the first roller may be greater than a width of a slit from among the plurality of slits that is drawn out by the second roller.

The display panel may include a display area including the plurality of pixels and the screen configured to display and image, and a dummy area at respective end portions of the display area and not configured to display the screen, and the dummy area may overlap the combining portion and may be connected to the combining portion.

The expandable display device may further include a fastening plate providing the dummy area and the combining portion between the sliding portion and fixing the same to each other, and the fastening plate may be parallel to the sliding portion and fastened thereto.

The fixing portion may further include a pair of connecting sides connecting the respective sides to each other, and the pair of connecting sides may each include a guide groove for guiding a path in which a moving member protruding from the sliding portion is inserted and moves.

An inner wall of the guide groove contacting an end portion of the moving member may include a slanted side, and a length of the moving member may be configured to change when the moving member is moved along a surface of the slanted side.

The moving member may include a hydraulic pressure cylinder or a spring for changing a length thereof.

The slanted side may include a plurality of sub-slanted sides.

According to embodiments of the present disclosure, a sliding portion of an expandable display device may be drawn out or inserted more freely and stably, and the expandable display device for improving supportability on a display panel may be provided.

BRIEF DESCRIPTION OF THE DRAWINGS

FIG. 1A shows a front elevational view of an expandable display device in an inserted configuration according to an exemplary embodiment.

FIG. 1B shows a front elevational view of the expandable display device of FIG. 1A in an expanded configuration according to an exemplary embodiment.

FIG. 2 shows a cross-sectional view of the expandable display device of FIGS. 1A-1B taken along the line II-II of FIG. 1B.

DETAILED DESCRIPTION

Figure 3:
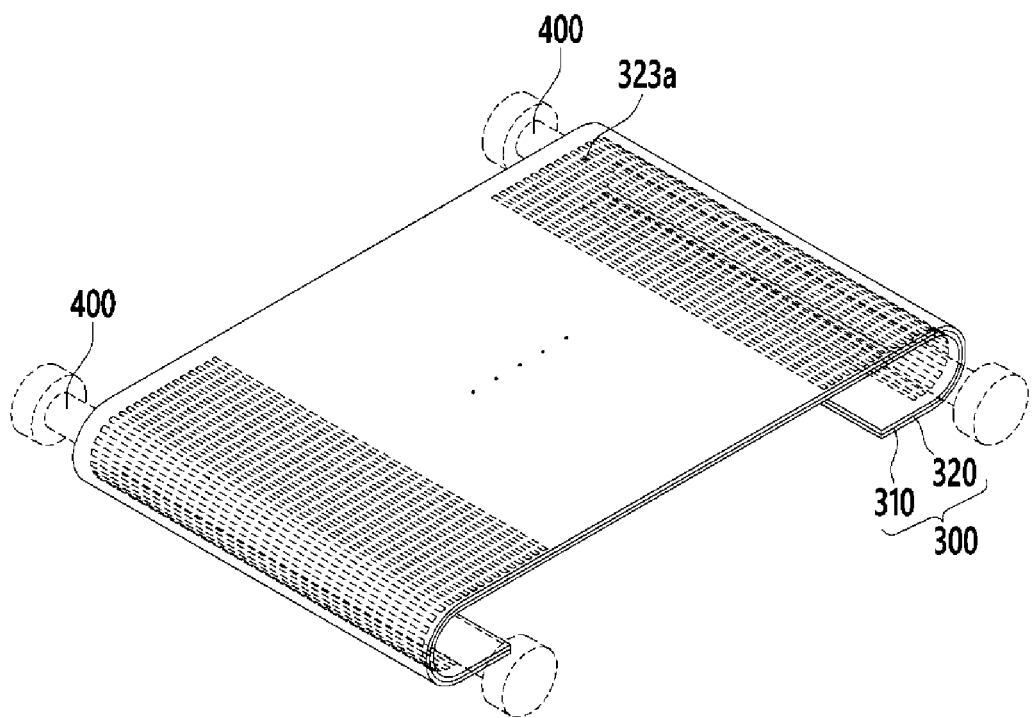
FIG. 3 shows a perspective view of a panel unit and a pair of rollers according to an exemplary embodiment.

Exemplary embodiments are described herein with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. In describing embodiments of the present invention, a description of known functions or configurations may be omitted so as to make the subject matter of the present invention more clear.

To more clearly describe the present invention, portions which do not relate to the description may be omitted, and, unless otherwise noted, like reference numerals designate like elements throughout the attached drawings and the written description, and thus, descriptions thereof may not be repeated.

In the drawings, the relative sizes and thicknesses of layers, films, panels, regions, etc., may be exaggerated for clarity. It will be understood that, although the terms "first," "second," "third," etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "lower," and the like, may be used herein for ease of explanation to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element such as a layer, film, region, or substrate is referred to as being "on" or "connected to" another element, it can be directly on or directly connected to the other element, or one or more intervening elements may also be present. In addition, it will also be understood that when an element is referred to as being "between" two elements, it can be the only element between the two elements, or one or more intervening elements may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." In addition, the use of alternative language, such as "or," when describing embodiments of the present invention, refers to "one or more embodiments of the present invention" for each corresponding item listed. As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

An expandable display device 1000 according to an exemplary embodiment is described below with reference to FIG. 1A, FIG. 1B, and FIG. 2. FIG. 1A shows a front elevational view of the expandable display device 1000 in an inserted configuration (e.g., when a sliding portion 200 of the expandable display device 1000 is inserted into a housing 100) according to an exemplary embodiment, and FIG. 1B shows a front elevational view of the expandable display device in an expanded configuration (e.g., when the sliding portion 200 is drawn out from the housing 100) according to an exemplary embodiment, and FIG. 2 shows a cross-sectional view of the expandable display device 1000 taken along the line II-II of FIG. 1B.

According to one or more embodiments, the expandable display device 1000 includes a display panel 310. The display panel 310 is provided on an expanding display unit EX and may be inserted into the housing 100, which is provided on a fixing display unit FX, and may display a screen through the housing 100 (see, e.g., FIG. 1A). The display panel 310 may be drawn (or drawn out) from respective sides of the housing 100 provided on the fixing display unit FX to form the expanding display unit EX, and one larger continuous screen may be displayed through the display panel 310 expanded through the expanding display unit EX and the fixing display unit FX (see, e.g., FIG. 1B).

To be reduced as shown in FIG. 1A (or to provide the inserted configuration) or to be expanded as shown in FIG. 1B (or to provide the expanded configuration), the expandable display device 1000 according to an exemplary embodiment may include the housing 100, a pair of sliding portions 200, a panel unit 300, and a pair of rollers 400, as shown in FIG. 2.

The housing 100 includes a fixing portion, and is provided to the fixing display unit FX, even when the pair of sliding portions 200 are drawn out. Therefore, the fixing portion may continuously display the screen (or a portion of the screen) through the display panel 310 disposed in the fixing display unit FX irrespective of drawing out or inserting of the pair of sliding portions 200 (or whether the expandable display device 1000 is in the inserted configuration or in the expanded configuration). The pair of sliding portions 200 may be drawn out of the housing 100, as shown in FIG. 2, and the housing 100 and the fixing portion may have equivalent (or the same or substantially the same) configurations.

The fixing portion may have a rectangular shape (or a substantially rectangular shape) including a pair of respective sides (or first sides) 110 facing each other, and a pair of connecting sides (or second sides) 120 for connecting between the pair of respective sides 110 (or for connecting the pair of respective sides 110 to each other). However, the present disclosure is not limited thereto, and the fixing portion may have any suitable shape. The pair of respective sides 110 and the pair of connecting side 120 may be linear (or may have a substantially linear shape), but embodiments of the present disclosure are not limited thereto, and the pair of respective sides 110 and the pair of connecting sides 120 may be curved, for example. Further, a crossing portion (or connecting portion) of the respective sides 110 and the connecting side 120 may be formed to have a rounded corner, or may be formed to have an angled corner, for example.

The pair of sliding portions 200 are provided on (or at) each of the respective sides 110 of the fixing portion, and are combined with the respective sides 110 to be drawn out from the housing 100 so that a distance from the fixing portion may be changed. In other words, one of the sliding portions 200 is at one of the respective sides 110, and another of the sliding portions 200 is at another of the respective sides 110. The sliding portion 200 according to an exemplary embodiment is drawn outside from the housing 100 to form (or expose) the expanding display unit EX, as shown in FIG. 1B. When the pair of sliding portions 200 are drawn outside the housing 100 to form the expanding display unit EX, the expanding display unit EX may display the screen on a portion of the display panel 310 that is disposed on the pair of sliding portions 200.

The panel unit 300 including a display panel 310 according to an exemplary embodiment includes the fixing display unit FX provided on the fixing portion, and the expanding display unit EX respectively provided on the pair of sliding portions 200 and having a variable exposing area when the sliding portion 200 moves.

A portion of the display panel 310 that is provided on the expanding display unit EX extends from a portion of the display panel 310 that is provided on the fixing display unit FX and is integrally formed with the portion of the display panel 310 on the fixing display unit FX. The portion of the display panel 310 on the expanding display unit EX may display a screen that is connected to a screen displayed by the portion of the display panel 310 provided on the fixing display unit FX.

The pair of sliding portions 200 may pass through the respective sides 110 of the fixing portion and may be inserted into the housing 100. When the pair of sliding portions 200 are inserted into the housing 100, the screen is displayed through the display panel 310 disposed on the housing 100 provided on the fixing display unit FX, as shown in FIG. 1A.

A center portion of the panel unit 300 is combined to the housing 100 and is not transformed by the drawing out or insertion of the pair of sliding portions 200, and the respective end portions are combined to the pair of sliding portions 200 and are transformed by the drawing out or insertion of the sliding portions 200.

In more detail, when the sliding portion 200 is drawn out from the housing 100 or is inserted into the housing 100, the panel unit 300 is also drawn out of or inserted into the housing 100 together with the sliding portion 200, and when the external shape of the panel unit 300 according to an exemplary embodiment is changed, an exposing area (or exposed area) of the panel unit 300 may also be changed. A combination structure of the panel unit 300 and the sliding portion 200 is described further below with reference to FIG. 12.

As shown in FIG. 2, of the pair of rollers 400 are provided on respective end portions of the pair of sliding portions 200 to support the drawing out or insertion of the panel unit 300. For example, the panel unit 300 may be drawn out or inserted by a friction force between the panel unit 300 and the roller 400 by a rotation of the roller 400 according to an exemplary embodiment, and as the panel unit 300 moves, the exposing area of the expanding display unit EX may be changed.

FIG. 3 shows a panel unit 300 and a pair of rollers 400 according to an exemplary embodiment. As shown in FIG.

3, part of a surface of the roller 400 is surrounded by the panel unit 300, and the panel unit 300 contacting the surface of the roller 400 moves by friction applied by rotation of the roller 400.

For example, the panel unit 300 may include the flexible display panel 310 and a support panel 320, as shown in FIG. 3. The flexible display panel 310 includes a plurality of pixels and displays the screen to one side (or a first side) (or is configured to display the screen at the first side of the display panel 310), and has a flexible characteristic such that an external shape of the flexible display panel 310 may be changed according to the drawing out or insertion of the sliding portion 200. An external shape of the support panel 320 may also be changed according to the drawing out or insertion of the sliding portion 200, and is attached to another side of the flexible display panel 310 facing the first side of the flexible display panel 310 to support the flexible display panel 310.

The support panel 320 includes a support portion 322 and a cover portion 324. The support portion 322 is provided inside the support panel 320, and has relatively greater rigidity as compared to the cover portion 324 to support the display panel 310. For example, the support portion 322 may be made of a metal that is light (or lightweight) and highly flexible and is easily transformable, such as aluminum, or may be made of a synthetic resin, such as polycarbonate.

The cover portion 324 covers a surface of the support portion 322 to planarize the surface (or to make the externally exposed surface planar or substantially planar). In some embodiments, the support portion 322 includes a plurality of slits 323a. The cover portion 324 covers the surface of the support portion 322 including the plurality of slits 323a to make it planar so that the plurality of slits 323a may be invisible (or not visible) from outside.

The cover portion 324 may be made of a synthetic resin, such as polyethylene terephthalate (PET), that is easily transformed.

Figure 4:
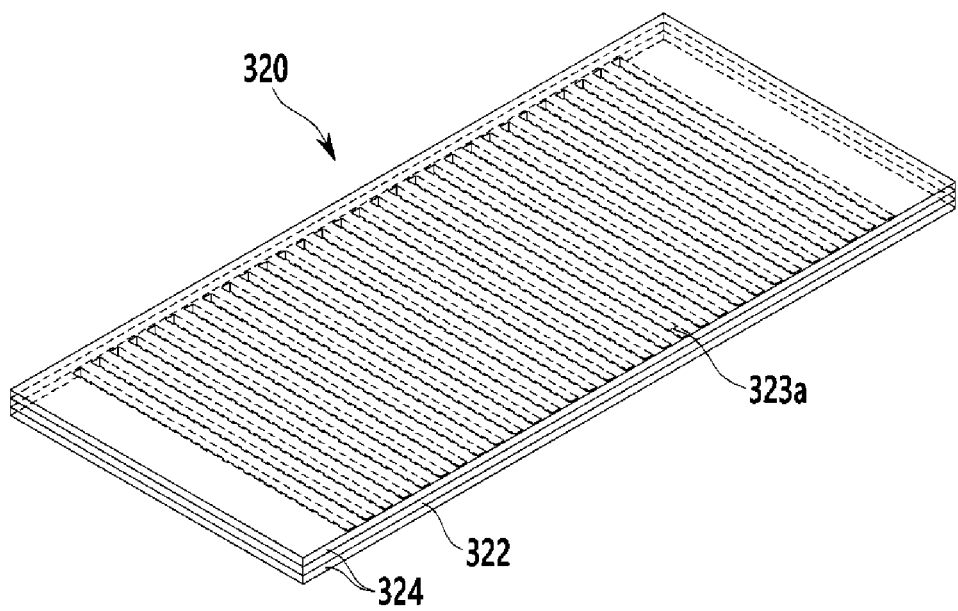
FIG. 4 shows a perspective view of a cover portion according to an exemplary embodiment.
Figure 5:
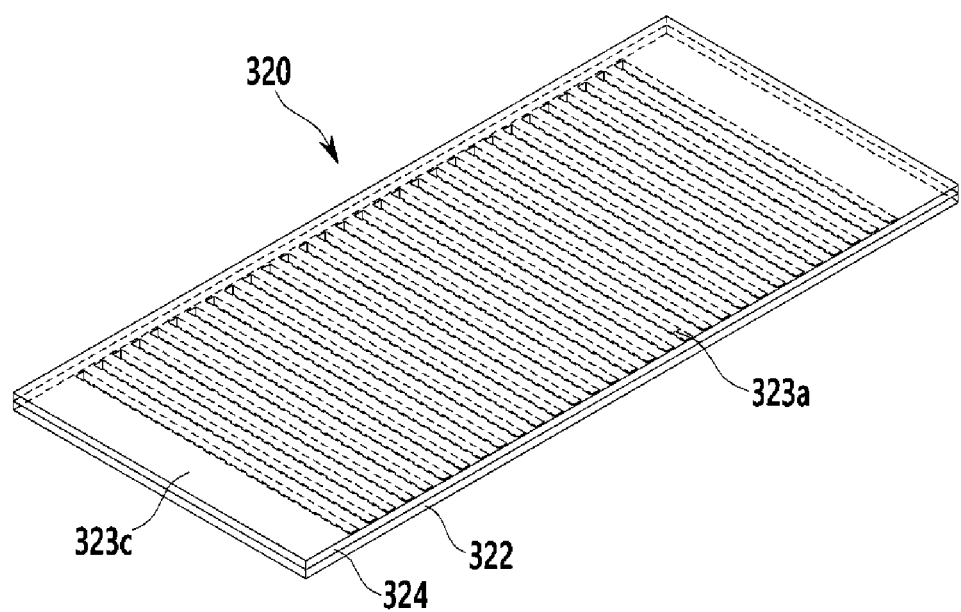
FIG. 5 shows a perspective view of a cover portion according to another exemplary embodiment.

FIG. 4 and FIG. 5 each show a cover portion 324 according to an exemplary embodiment and an exemplary variation thereof.

The cover portion 324 may cover respective sides of the support portion 322 as shown in FIG. 4, or the cover portion 324 may cover one side of the support portion 322, in a like manner of an exemplary variation shown in FIG. 5.

The support panel 320 may be manufactured by an injection method so that the support portion 322 may be disposed inside the support panel 320, and the cover portion 324 may be disposed on the surface thereof, but the present disclosure is not limited thereto. In addition, the cover portion 324 may be formed as a coated side by coating the surface of the support portion 322, and the support portion 322 and the cover portion 324 may be additionally manufactured and may be attached thereto.

The cover portion 324 may be made of a synthetic resin with adherence, so that without an additional adhesive, the cover portion 324 may be attached to the other side of the display panel 310 by the synthetic resin forming the cover portion 324.

FIGS. 6-9 show numerous exemplary variations of a support portion 322 according to an exemplary embodiment.

FIGS. 6-9 show an exemplary embodiment where the cover portion 324 is disposed on one side of the support portion 322, in an exploded perspective view of the cover portion 324 and the support portion 322 for better understanding.

It will be appreciated that embodiments in which the support portion 322 is completely inserted into the cover portion 324 (see, e.g., FIG. 4) as well as the exemplary embodiment in which the cover portion 324 is disposed on one side of the support portion 322 (see, e.g., FIG. 5) may be described according to FIGS. 6-9.

As shown in FIGS. 4-9, the support portion 322 includes the plurality of slits 323a formed in the expanding display unit EX. The plurality of slits 323a may extend in a direction traversing the drawing out or inserting direction of the sliding portion 200.

The slits 323a are not formed at an end portion of the support portion 322 of the expanding display unit EX, and a combining portion 323c, which may be planar (or may be formed to be a planar side) is provided on (or at) the end portion of the support portion 322. The support panel 320 contacts the surface of the roller 400 to surround the surface of the roller 400 (see, e.g., FIG. 2 and FIG. 3), the combining portion 323c of the support portion 322 is disposed to face the plurality of slits 323a.

Figure 6:
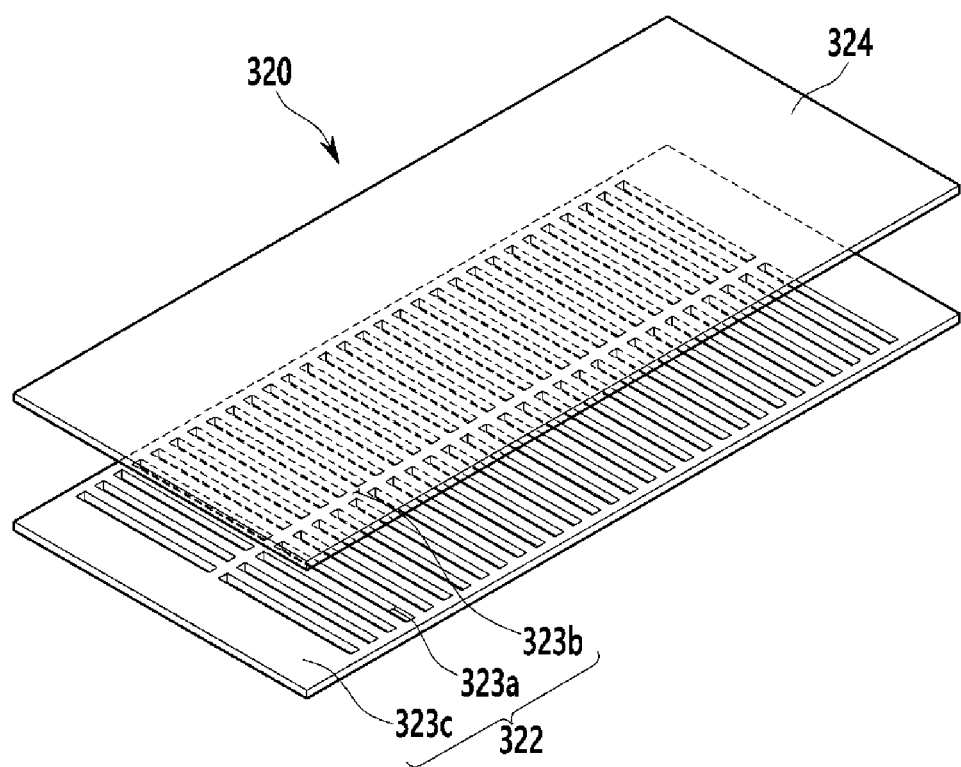
FIG. 6 shows a perspective view of a support portion according to an exemplary embodiment.
Figure 7:
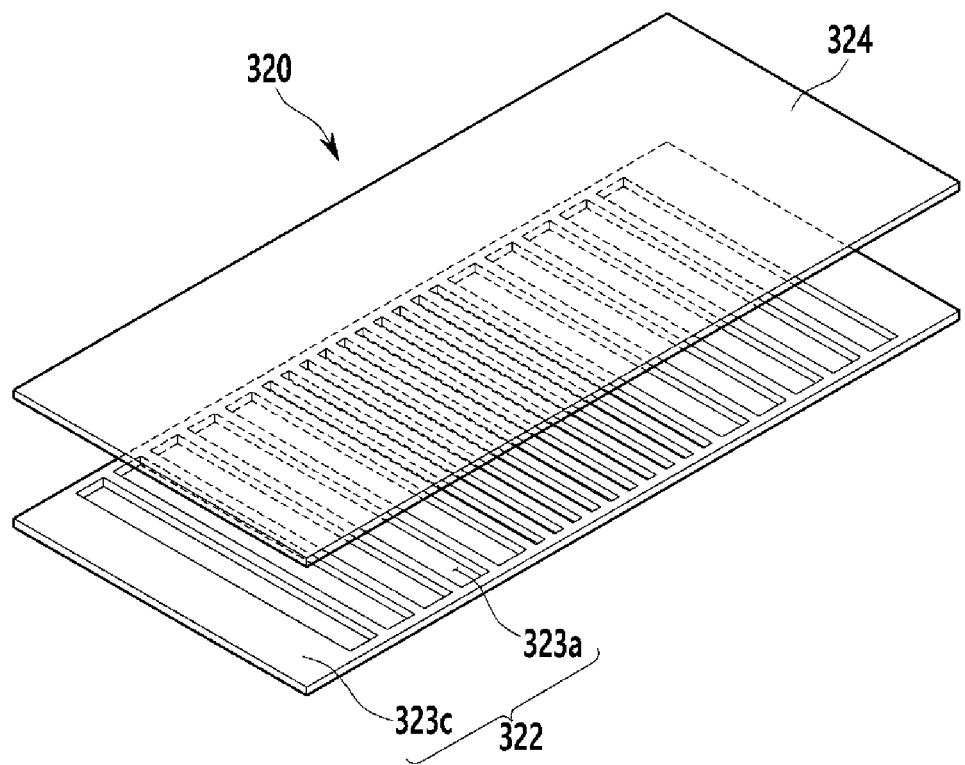
FIG. 7 shows a perspective view of a support portion according to another exemplary embodiment.
Figure 8:
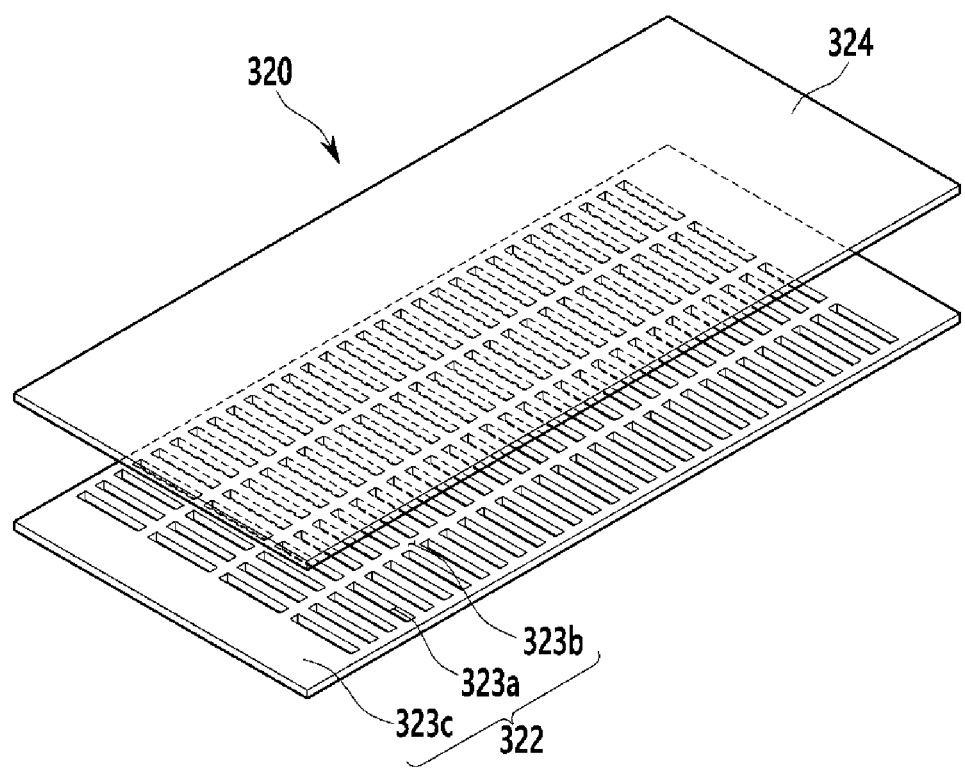
FIG. 8 shows a perspective view of a support portion according to another exemplary embodiment.

The plurality of slits 323a may be respectively formed to be through-holes as shown in FIG. 4 and FIG. 5, but embodiments of the present disclosure are not limited thereto, and the slits 323a according to exemplary variations shown in FIG. 6 to FIG. 8 may include a bridge 323b for partitioning one through-hole into a plurality of through-holes, for example.

The bridge 323b may extend in parallel to the drawing out or inserting direction of the sliding portion 200, and cuts off (or separates) the slits 323a penetrated in one direction. Therefore, as described above, the through-hole forming one slit 323a may be partitioned by the bridge 323b.

Figure 9:
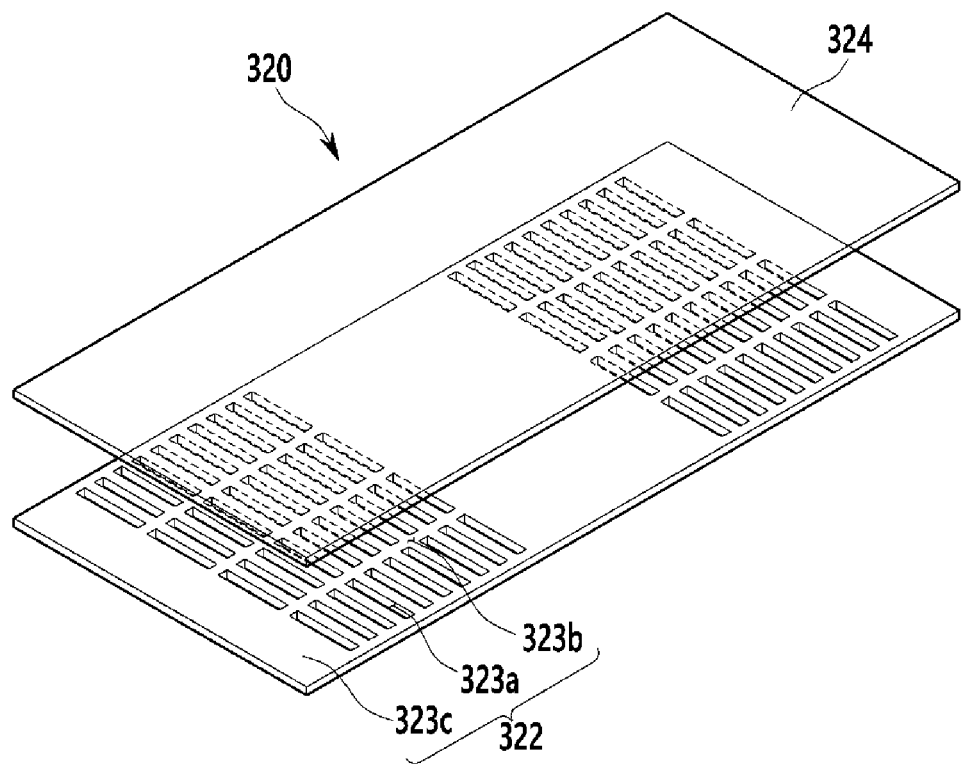
FIG. 9 shows a perspective view of a support portion according to another exemplary embodiment.

The slit 323a of FIG. 6 according to an exemplary variation of an exemplary embodiment is shown such that one bridge 323b is formed in (or at) one slit 323a (or each slit 323a), and in some embodiments (e.g., as shown in FIG. 8 or FIG. 9), a plurality of bridges 323b may be formed in (or at) one slit 323a.

Further, when the support portion 322 of the fixing display unit FX includes the plurality of slits 323a, widths of the plurality of slits 323a provided at (or on) the fixing display unit FX may be formed to be different from widths of the plurality of slits 323a provided at (or on) the expanding display unit EX, as shown in FIG. 7.

According to embodiments, the sliding portion 200 may be drawn out from or inserted into the housing 100 by moving the sliding portion 200 along a first direction. It will be appreciated that, as used herein, the "first direction" refers to a first direction extending in both a positive and negative direction (e.g., the sliding portion 200 moves along the first direction in the positive first direction and the negative first direction). The plurality of slits 323a each extend (or have a length in) a second direction crossing or traversing the first direction is (e.g., perpendicular to the first direction). As used herein, the width of each of the slits 323a represents a distance that is measured along the first direction (or that is measured perpendicular with respect to the length direction of the slit 323a or that is measured along a direction perpendicular to the second direction). Therefore, in an exemplary embodiment, the width signifies the length inside the slit 323a measured in parallel to the drawing out or inserting direction of the sliding portion 200 (or measured in parallel to the first direction).

As shown in FIG. 7, the fixing display unit FX (having relatively high supportability (or rigidity) for the display panel 310 as compared to the expanding display unit EX of which the external shape may be changed when the sliding portion 200 is drawn out or inserted into the housing 100) includes a slit 323a that is narrower than a slit 323a provided in the expanding display unit EX. For example, widths of a plurality of slits 323a provided in the expanding display unit EX may be greater than widths of a plurality of slits 323a provided in the fixing display unit FX.

In addition, to acquire (or provide) greater supportability (or rigidity) for the display panel 310 provided on the fixing display unit FX, the support panel 320 of the fixing display unit FX may be formed to have a planar side without the plurality of slits 323a, as shown in FIG. 9.

Figure 10:
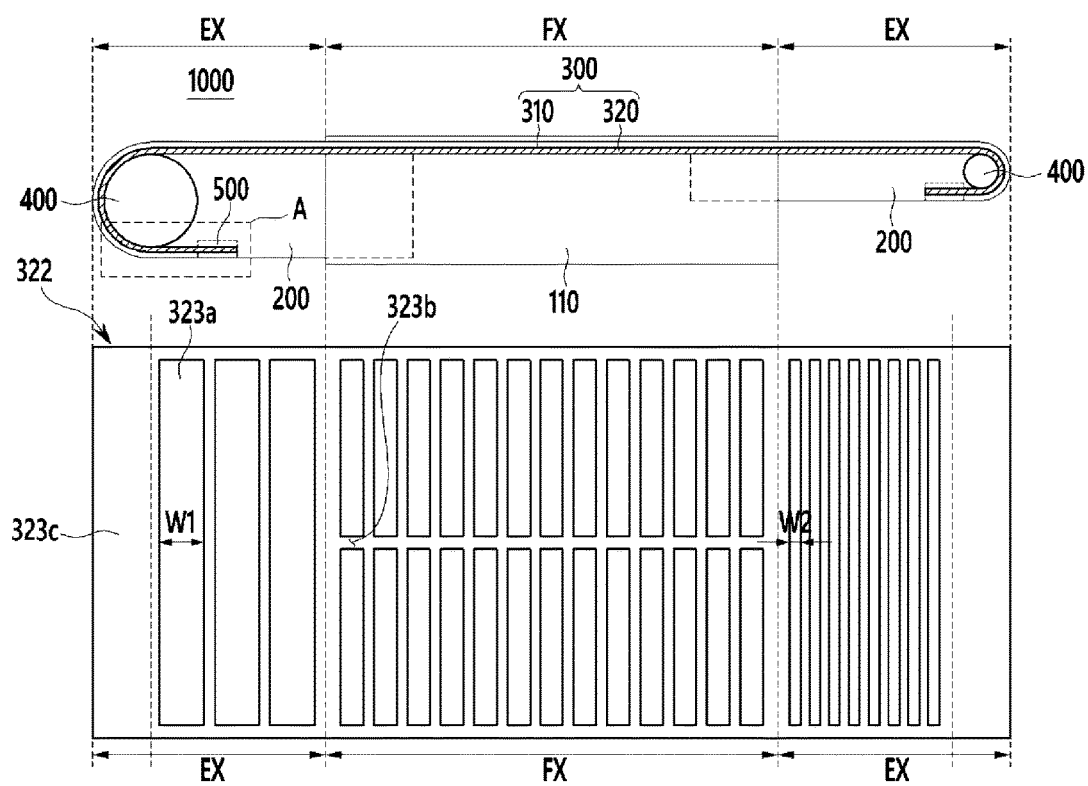
FIG. 10 shows a side elevational view and a plan view of a support portion including a plurality of slits according to another exemplary embodiment.

The width of the slit 323a may be influenced by a diameter of the roller 400. As shown in FIG. 2, the pair of rollers 400 may each have a different diameter. FIG. 10 shows the support portion 322 including a plurality of slits 323a having different widths depending on (or according to) the diameter of the roller 400 according to another exemplary variation of an exemplary embodiment.

As shown in FIG. 2 and FIG. 10, the diameter of one of the pair of rollers 400 may be greater than the diameter of the other one of the pair of rollers 400. As such, when the sliding portion 200 is inserted into the housing 100, the sliding portion 200 inserted by the roller 400 having the smaller diameter may be inserted inside the sliding portion 200 that is inserted by the roller 400 having the larger diameter to have the pair of sliding portions 200 overlap.

When the pair of rollers 400 with different diameters are included so that the pair of sliding portions 200 may be disposed to overlap each other according to an exemplary variation, interference generated by the insertion of the sliding portion 200 may be effectively avoided, or likelihood thereof may be reduced, so that a more stable operation of the expandable display device 1000 is allowable.

In some embodiments, a portion of the plurality of slits 323a formed in the expanding display unit EX at the side including the roller 400 with the larger diameter each have a greater width than a portion of the plurality of slits 323a formed in the expanding display unit EX at the side including the roller 400 with the smaller diameter. For example, the plurality of slits 323a with a relatively greater width $W_1$ may be formed at a side of the roller 400 with a greater diameter, and the plurality of slits 323a with a relatively smaller width $W_2$ may be formed at a side of the roller 400 with a smaller diameter. As described, by forming the different widths of the slits 323a so as to correspond to the diameter of the roller 400, the stress generated when the support panel 320 is bent to wrap around the surface of the roller 400 may be more efficiently dispersed (or distributed).

Further, as shown in FIG. 10, the support portion 322 of the expanding display unit EX, of which the external shape is changed when the sliding portion 200 is drawn out or inserted, may include the plurality of slits 323a formed as through-holes, and an exemplary variation in which the plurality of slits 323a including the bridge 323b are formed in the support portion 322 of the fixing display unit FX needing higher supportability for the display panel 310 compared to the expanding display unit EX is allowable (or may be provided).

Figure 11:
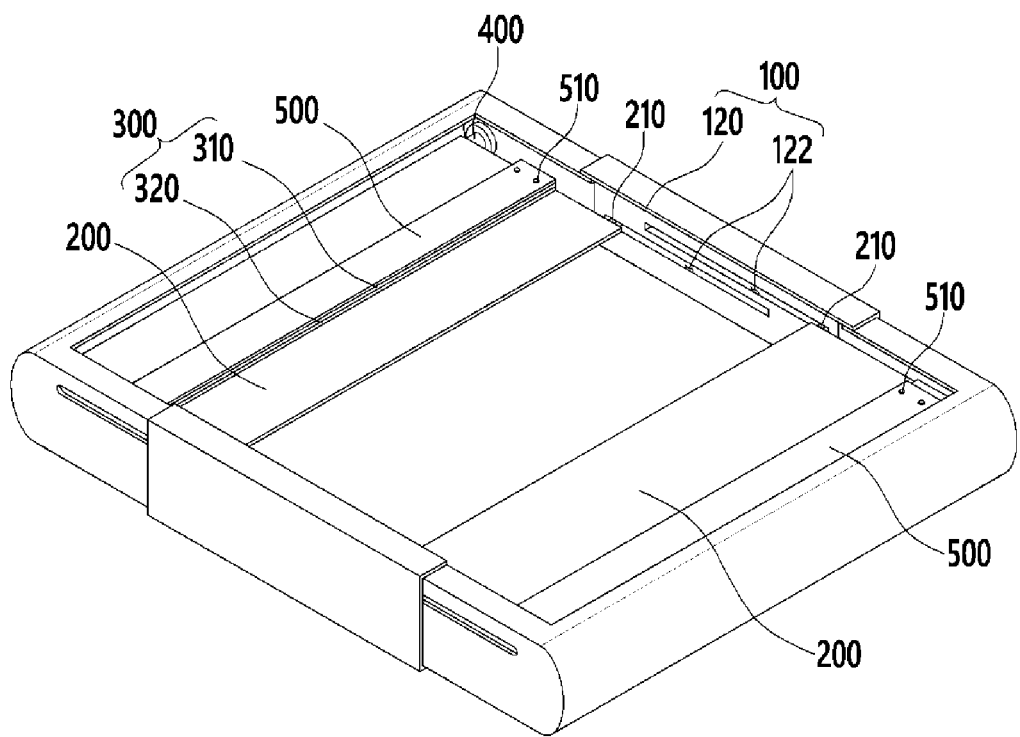
FIG. 11 shows a perspective view of a lower internal portion of an expandable display device according to an exemplary embodiment.
Figure 12:
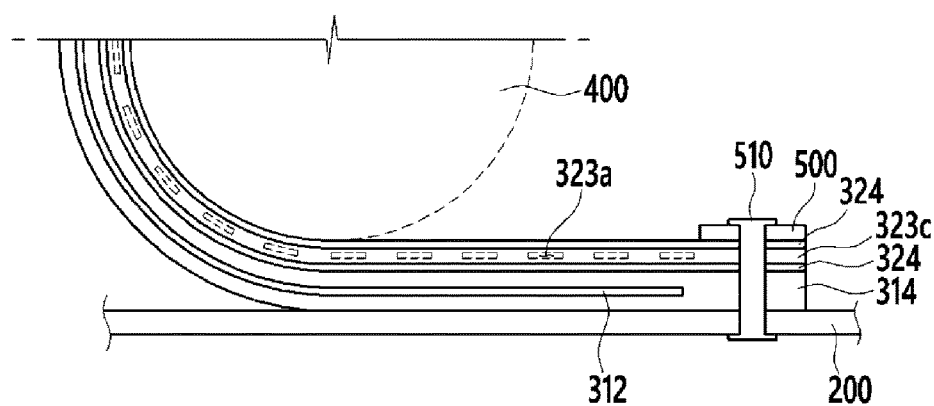
FIG. 12 shows an enlarged view of the area A of FIG. 2.

FIG. 11 shows a perspective view of a lower internal portion of an expandable display device according to an exemplary embodiment, and FIG. 12 shows an enlarged view of the area A of FIG. 2.

As shown in FIG. 11 and FIG. 12, the expandable display device 1000 according to an exemplary embodiment may further include a fastening plate 500.

As described above, the combining portion 323c formed to have a planar side (and without the plurality of slits 323a) is provided at (or on) respective end portions of the support portion 322 according to an exemplary embodiment. For example, the display panel 310 according to an exemplary embodiment may include a display area 312 and a dummy area 314. The display area 312 represents a region that includes a plurality of pixels and may display a screen (or configured to display a screen or image), and the dummy area 314 represents a region provided at (or on) respective end portions of the display area 312 and not displaying the screen (or not configured to display the screen or the image). The dummy area 314 is provided at (or on) the respective end portions of the display area 312 so the display area 312 may be formed between the dummy areas 314.

The dummy area 314 may not include a plurality of pixels so it may not display the screen, or it may include dummy pixels that are not actually operable when a plurality of pixels are formed therein so it may not display the screen.

The display panel 310 may be attached to one side of the support panel 320 according to an exemplary embodiment. For example, the dummy area 314 of the display panel 310 may be provided on (or at) the position corresponding to the combining portion 323c of the support portion 322. For example, the combining portion 323c provided on (or at) the respective end portions of the support portion 322 and the dummy area 314 provided on (or at) the respective end portions of the display panel 310 may be disposed to overlap each other.

The respective end portions of the panel unit 300 including the combining portion 323c of the support portion 322 and the dummy area 314 of the display panel 310 may be disposed to wrap (or wrap around) the surface of the roller 400 and face a portion of the plurality of slits 323a. The combining portion 323c and a dummy panel facing a portion of the plurality of slits 323a may be fastened and fixed to the sliding portion 200. The combining portion 323c and the dummy panel are fastened to the sliding portion 200, so the panel unit 300 may be drawn out or inserted together when the sliding portion 200 is drawn out or inserted.

For example, the fastening plate 500 may be disposed in parallel to the sliding portion 200, and may provide the combining portion 323c and the dummy panel between the sliding portion 200 and the fastening plate 500. The combining portion 323c and the dummy panel disposed between the fastening plate 500 and the sliding portion 200 may be fixed and fastened to the sliding portion 200 by the fastening plate 500.

FIG. 12 exemplarily shows that an opening (or a through-hole) for penetrating part of the fastening plate 500, the support panel 320, the display panel 310, and the sliding portion 200 is formed, and the fastening plate 500, the support panel 320, the display panel 310, and the sliding portion 200 are fastened by a fastening member 510 inserted into the through-hole. However, in some exemplary embodiments, the fastening plate 500, the support panel 320, the display panel 310, and the sliding portion 200 may be fixed by an adhesive, for example.

Figure 13:
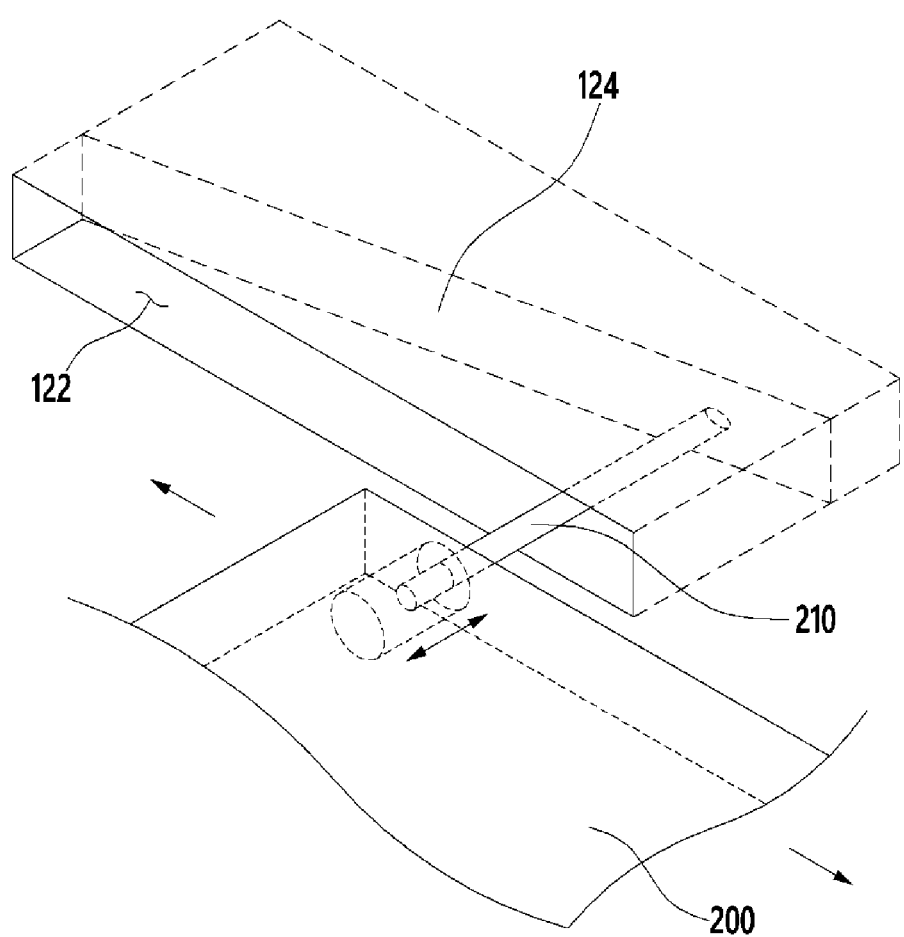
FIG. 13 shows a perspective view of a moving member that is inserted into a guide groove according to an exemplary embodiment.

As shown in FIG. 11, a guide groove 122 is formed on a pair of connecting sides 120 of the housing 100 according to an exemplary embodiment. FIG. 13 shows a moving member 210 that is inserted into a guide groove 122 and is movable along the guide groove 122, according to an exemplary embodiment. As shown in FIG. 13, the moving member 210 protrudes from the sliding portion 200 and is inserted into the guide groove 122. The guide groove 122 guides a moving path of the moving member 210, and the moving member 210 moves along the guide groove 122 to support the drawing out or insertion of the sliding portion 200.

For example, as shown in FIG. 13, the guide groove 122 may include an inner wall configured with a slanted side 124. An end portion of the moving member 210 may move along a surface of the slanted side 124 and its length may be variable.

Figure 14:
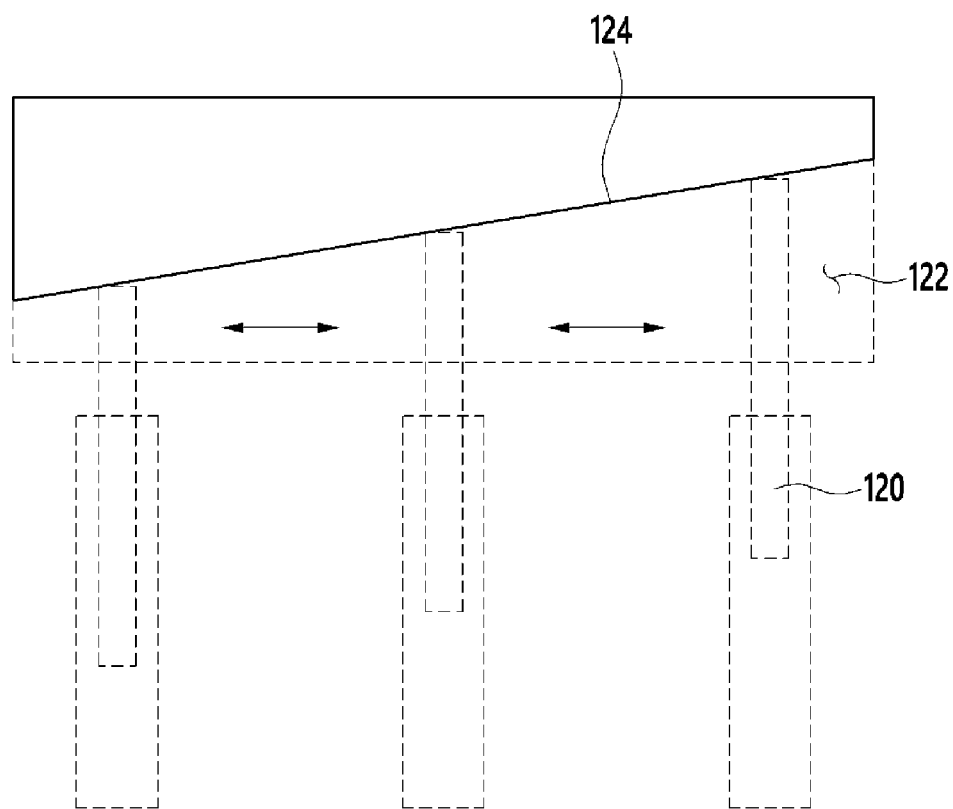
FIG. 14 shows a top plan view of a moving member and a guide groove according to an exemplary embodiment.

The change of the length of the moving member 210 is described in further detail with reference to FIG. 14 and FIG. 15. FIG. 14 shows a top plan view of the moving member 210 of which a length is changed when moving on the slanted side 124 of the guide groove 122 according to an exemplary embodiment, and FIG. 15 shows a top plan view of one exemplary variation of the slanted side 124 shown in FIG. 14.

Figure 15:
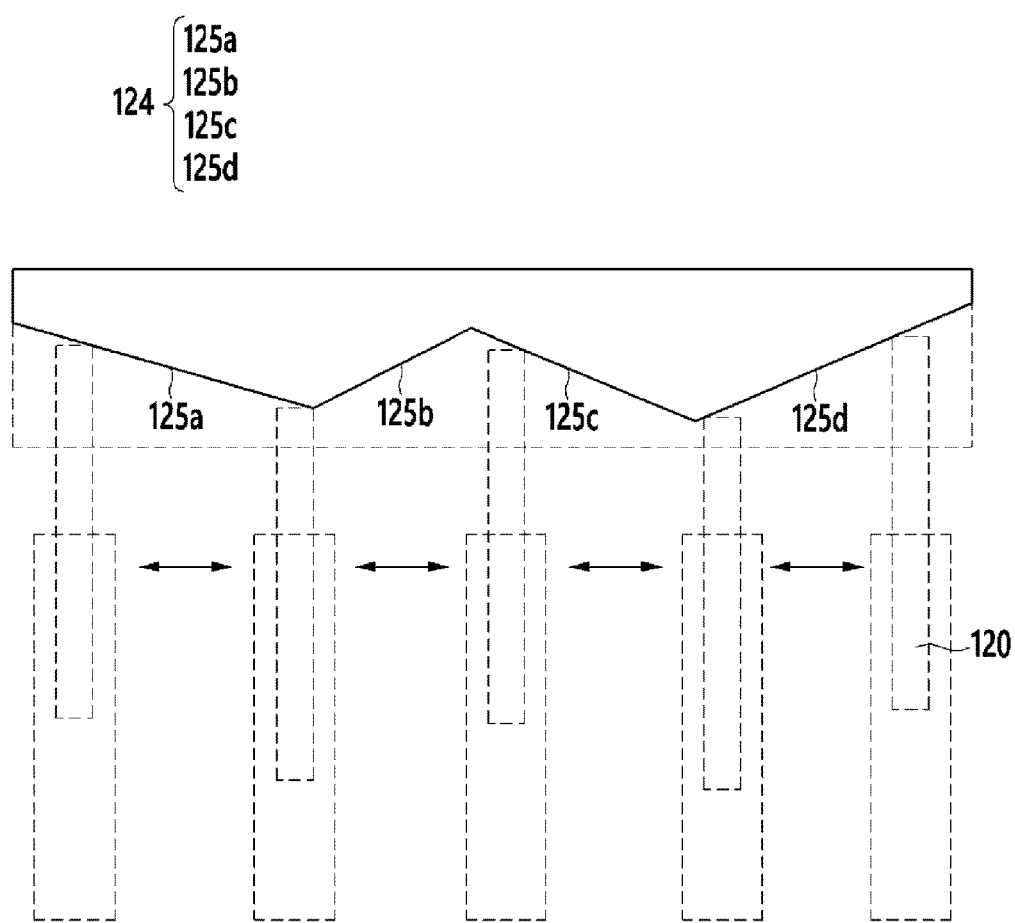
FIG. 15 shows a top plan view of a moving member and a guide groove according to another exemplary embodiment.

As shown in FIG. 14 and FIG. 15, the guide groove 122 includes the slanted side 124 on which an inclination is formed to cross a movement direction of the moving member 210. The movement direction of the moving member 210 is parallel to the drawing out or inserting direction of the sliding portion 200 (e.g., is parallel to the first direction), so the slanted side 124 according to an exemplary embodiment and an exemplary variation has a height in a crossing direction of the drawing out or inserting direction of the sliding portion 200 (e.g., has a height in the second direction).

The end portion of the moving member 210 may move along the surface of the slanted side 124. For example, the length of the moving member 210 is reduced at a position where a distance between the slanted side 124 and an entrance of the guide groove 122 is short, and the length of the moving member 210 is increased at a position where a distance between the slanted side 124 and the entrance of the guide groove 122 is long.

The moving member 210 may include a hydraulic pressure cylinder or a spring so that the distance may be changed according to an inclined degree determined by the distance between the slanted side 124 and the entrance of the guide groove 122. When the distance between the slanted side 124 and the entrance of the guide groove 122 is reduced, a pressure is applied to the moving member 210 including a hydraulic pressure cylinder or a spring so the length of the moving member 210 may be reduced or changed.

In some embodiments, a reaction force is generated against the pressure applied in the direction for reducing the length of the moving member 210. The generated reaction force represents a force for hindering a reduction of the length of the moving member 210, and the movement of the moving member 210 is thus hindered by the reaction force. Therefore, the moving speed of the moving member 210 may be controlled by using the reaction force caused by the change of the length of the moving member 210.

When a plurality of sub-slanted sides 125a, 125b, 125c, and 125d are included, as shown in FIG. 15, for example the moving member 210 for controlling a moving speed by stages may be provided. Therefore, the moving speed of the sliding portion 200 including a moving member 210 may also be controlled by stages.

The expandable display device 1000 according to an exemplary embodiment and numerous exemplary variations have been described. According to an exemplary embodiment and exemplary variations, the expandable display device 1000 for more freely and stably drawing out or inserting the sliding portion 200 and improving the supportability for the display panel 310 may be provided.

Specific exemplary embodiments have been described and illustrated above, but the present invention is not limited to the above-mentioned exemplary embodiments. Therefore, the present invention can be variously changed and modified from the description by a person skilled in the art to which the present invention pertains without departing from the idea and scope of the present invention as defined by the following claims, and equivalents thereof. Therefore, the modified examples or the changed examples are not to be individually construed from the technical spirit or aspect of the present invention, so the modified exemplary embodiments are to be construed to be included in the claims of the present application.

What is claimed is:

1. An expandable display device comprising:
   a housing comprising a fixing portion;
   a pair of sliding portions provided at respective sides of the fixing portion, each of the sliding portions being configured to be drawn out from the housing along a first direction such that a distance from the respective sliding portion to the fixing portion is changed; and
   a panel unit comprising:
      a flexible display panel comprising a plurality of pixels and having a screen at a first side thereof; and
      a support panel attached to a second side of the flexible display panel facing the first side, the support panel comprising a plurality of slits extending in a second direction crossing the first direction.

2. The expandable display device of claim 1, wherein the support panel comprises a bridge extending in the first direction and dissecting the plurality of slits.

3. The expandable display device of claim 2, wherein the bridge comprises a plurality of bridges.

4. The expandable display device of claim 1, wherein the plurality of slits are at a portion of the support panel corresponding to the fixing portion of the housing.

5. The expandable display device of claim 4,
   wherein the plurality of slits are further at a portion of the support panel corresponding to the pair of sliding portions, and
   wherein widths of slits from among the plurality of slits that are at the portion of the support panel corresponding to the pair of sliding portions are greater than widths of slits from among the plurality of slits that are at the portion of the support panel corresponding to the fixing portion of the housing.

6. The expandable display device of claim 1, wherein the support panel comprises:
   a support portion having the plurality of slits and supporting the flexible display panel; and
   a cover portion covering a side of the support portion.

7. The expandable display device of claim 1, further comprising a roller at an end portion of one of the sliding portions, the roller being configured to rotate to change and exposing area of the flexible display panel,
   wherein the support panel contacts a surface of the roller and wraps around the surface of the roller,
   wherein the end portion of the support panel further includes a combining portion that is substantially planar and faces the plurality of slits.

8. The expandable display device of claim 7, wherein the roller comprises a first roller and a second roller, the first roller having a diameter that is greater than a diameter of the second roller, and
   wherein a width of a slit from among the plurality of slits that is drawn out by the first roller is greater than a width of a slit from among the plurality of slits that is drawn out by the second roller.

9. The expandable display device of claim 7, wherein the flexible display panel comprises:

a display area comprising the plurality of the pixels and the screen configured to display an image; and a dummy area at respective end portions of the display area and not configured to display the image, the dummy area overlapping the combining portion and being connected to the combining portion.

10. The expandable display device of claim 9, further comprising a fastening plate providing the dummy area and the combining portion between the sliding portion and fixing the same to each other, the fastening plate being parallel to the sliding portion and fastened thereto.

11. The expandable display device of claim 1, wherein the fixing portion further comprises a pair of connecting sides connecting the respective sides to each other, and wherein the pair of connecting sides each include a guide groove for guiding a path in which a moving member protruding from the sliding portion is inserted and moves.

12. The expandable display device of claim 11, wherein an inner wall of the guide groove contacting an end portion of the moving member comprises a slanted side, and wherein a length of the moving member is configured to change when the moving member is moved along a surface of the slanted side.

13. The expandable display device of claim 12, wherein the moving member comprises a hydraulic pressure cylinder or a spring for changing a length thereof.

14. The expandable display device of claim 12, wherein the slanted side comprises a plurality of sub-slanted sides.

* * * * *